United States Patent
Kamimura

(10) Patent No.: US 12,293,939 B2
(45) Date of Patent: *May 6, 2025

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Kokusai Electric Corporation, Tokyo (JP)

(72) Inventor: Daigi Kamimura, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/486,786

(22) Filed: Oct. 13, 2023

(65) Prior Publication Data

US 2024/0038576 A1 Feb. 1, 2024

Related U.S. Application Data

(63) Continuation of application No. 16/818,510, filed on Mar. 13, 2020, now Pat. No. 11,823,946, which is a
(Continued)

(30) Foreign Application Priority Data

Sep. 25, 2017 (JP) .................. 2017-183183

(51) Int. Cl.
*H01L 21/687* (2006.01)
*H01J 37/32* (2006.01)
*H01L 21/67* (2006.01)

(52) U.S. Cl.
CPC .... *H01L 21/68764* (2013.01); *H01J 37/3244* (2013.01); *H01L 21/67017* (2013.01)

(58) Field of Classification Search
None
See application file for complete search history.

(56) References Cited

U.S. PATENT DOCUMENTS

2003/0097985 A1* 5/2003 Kitazawa .......... H01J 37/32834
118/715
2007/0215036 A1 9/2007 Park et al.
(Continued)

FOREIGN PATENT DOCUMENTS

JP 2010087231 A 4/2010
JP 2011216844 A 10/2011
(Continued)

OTHER PUBLICATIONS

Kaga et al, WO 2016/098183 A1, Semiconductor Manufacturing Method, Substrate Processing Device and Recording Medium; Jun. 23, 2016 (Year: 2016).

*Primary Examiner* — Alexander G Ghyka
(74) *Attorney, Agent, or Firm* — Edell, Shapiro & Finnan, LLC

(57) ABSTRACT

Described herein is a technique capable of forming a film on a substrate with good uniformity. According to one aspect of the technique of the present disclosure, there is provided a method of manufacturing a semiconductor device including: processing a substrate by performing a cycle a predetermined number of times, the cycle comprising: (a) supplying a source gas; (b) discharging at least the source gas; (c) supplying a reactive gas; and (d) discharging at least the reactive gas. The substrate is kept stationary while each cycle is performed, and a rotation angle of rotating the substrate is calculated based on the predetermined number of times after each cycle is completed.

19 Claims, 6 Drawing Sheets

Related U.S. Application Data continuation of application No. PCT/JP2018/009963, filed on Mar. 14, 2018.

(56) References Cited

U.S. PATENT DOCUMENTS

| | | |
|---|---|---|
| 2012/0315394 A1 | 12/2012 | Ito |
| 2013/0267100 A1 | 10/2013 | Takagi et al. |
| 2015/0225851 A1* | 8/2015 | Kim et al. |
| 2017/0287677 A1* | 10/2017 | Kato ................... H01J 37/3244 |
| 2017/0287716 A1 | 10/2017 | Kaga |
| 2018/0040502 A1* | 2/2018 | Kon ................... H01L 21/67115 |

FOREIGN PATENT DOCUMENTS

| | | |
|---|---|---|
| JP | 2013232624 A | 11/2013 |
| JP | 2018026528 A | 2/2018 |
| KR | 20070093914 A | 9/2007 |
| WO | 2016098183 A1 | 6/2016 |

* cited by examiner

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS REFERENCE TO RELATED APPLICATIONS

This non-provisional U.S. patent application is a continuation of U.S. patent application Ser. No. 16/818,510, filed Mar. 13, 2020, which is a continuation of International Application No. PCT/JP2018/009963, filed on Mar. 14, 2018, which claims priority under 35 U.S.C. § 119(a)-(d) to Japanese Patent Application No. 2017-183183, filed on Sep. 25, 2017, the entire contents of which are hereby incorporated by reference.

TECHNICAL FIELD

The present disclosure relates to a method of manufacturing a semiconductor device, a substrate processing apparatus and a non-transitory computer-readable recording medium.

BACKGROUND

A vertical type apparatus serving as a substrate processing apparatus may be used to perform a substrate processing such as a film-forming process. A boat (also referred to as a "substrate retainer") may be accommodated in a process chamber of the vertical type apparatus. A plurality of substrates (also referred to as wafers), for example, several tens to hundreds of substrates, may be arranged in the boat of the vertical type apparatus. The film-forming process may be performed on surface of each of the plurality of the substrates by supplying a process gas onto the plurality of the substrates accommodated in the boat and heating the plurality of the substrates. The film-forming process may be performed while an inner pressure or an inner temperature of the process chamber is set to a predetermined pressure or a predetermined temperature.

According to related arts, a step of forming an insulating film on a wafer (substrate) while rotating the wafer is disclosed.

SUMMARY

Described herein is a technique capable of forming a film with good uniformity on a substrate.

According to one aspect of the technique of the present disclosure, there is provided a substrate processing apparatus including: a process chamber in which a substrate is processed; a process gas supply system configured to supply a process gas into the process chamber; a rotating mechanism configured to rotate the substrate; and a controller configured to control the process gas supply system and the rotating mechanism to supply the process gas in a state where the substrate is stopped while a cycle of supplying the process gas is performed a predetermined number of times; and rotate the substrate by a predetermined angle obtained by dividing a circumference of the substrate equally by the predetermined number of times while the process gas is not supplied to the substrate.

DETAILED DESCRIPTION

Embodiments

Figure 1:
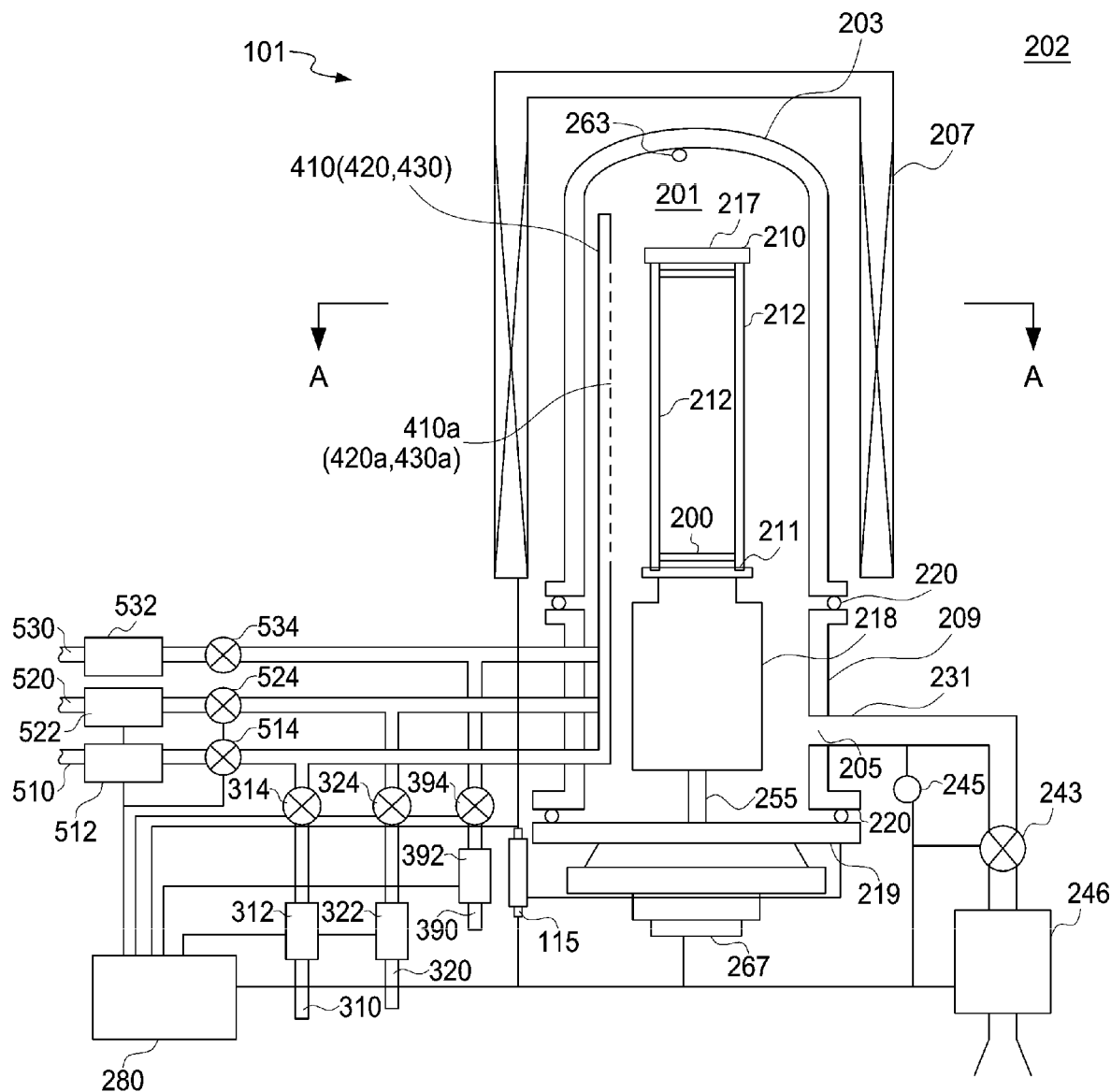
FIG. 1 schematically illustrates a vertical cross-section of a process furnace of a substrate processing apparatus according to one or more embodiments described herein.

Hereinafter, one or more embodiments (hereinafter, simply referred to as "embodiments") according to the technique of the present disclosure will be described with reference to the drawings. Like reference numerals represent like components in the drawings, and redundant descriptions related thereto will be omitted. In the drawings, for the sake of convenience of the descriptions, features such as a width, a thickness and a shape of each component may be schematically illustrated as compared with actual features. However, the drawings are merely examples of the embodiments, and the embodiments according to the technique of the present disclosure are not limited thereto.

(1) Processing Apparatus

A substrate processing apparatus (hereinafter, simply referred to as a "processing apparatus") according to the embodiments is configured as a semiconductor manufacturing apparatus that performs, for example, a substrate processing such as a film-forming process. The substrate processing is performed as one of manufacturing processes in a method of manufacturing a semiconductor device. In particular, according to the embodiments, a vertical type semiconductor manufacturing apparatus that performs the film-forming process on a substrate may be used as the substrate processing apparatus.

Hereinafter, a process furnace 202 of a substrate processing apparatus 101 will be described in detail with reference to FIG. 1.

The process furnace 202 includes a vertical type reaction tube (also simply referred to as a "reaction tube") 203 inside thereof. For example, the reaction tube 203 is of a substantially cylindrical shape with a closed upper end and an open lower end. The reaction tube 203 is arranged vertically such that the open lower end faces downward and a center line of the cylindrical shape of the reaction tube 203 is aligned in a vertical direction. The reaction tube 203 is fixedly supported by a housing (not shown) of the substrate processing apparatus 101. According to the embodiments, for example, the reaction tube 203 is made of a high heat resistant material such as quartz (SiO2) and silicon carbide (SiC). The reaction tube 203 is integrally formed as a single body of a highly heat resistant material in a substantially cylindrical shape.

A process chamber 201 in which a boat 217 serving as a substrate retainer is accommodated is provided in the reaction tube 203. A plurality of wafers including a wafer 200 serving as a substrate may be accommodated in horizontal orientation in the boat 217 in a multistage manner along a vertical direction. An inner diameter of the reaction tube 203 is set to be larger than a maximum outer diameter of the boat 217 accommodating the plurality of the wafers including the wafer 200.

A lower end portion of the reaction tube 203 is hermetically sealed by a furnace opening portion 209 whose horizontal cross-section is of a substantially circular ring shape. The reaction tube 203 is detachably provided to the furnace opening portion 209 for performing operations such as a maintenance operation, an inspection operation and a cleaning operation. By supporting the furnace opening portion 209 by the housing of the substrate processing apparatus 101, the reaction tube 203 is vertically provided on the housing of the substrate processing apparatus 101.

An exhaust pipe 231 serving as an exhaust line configured to exhaust an inner atmosphere of the process chamber 201 is connected to a part of a side wall of the furnace opening portion 209. An exhaust port 205 configured to exhaust the inner atmosphere of the process chamber 201 is provided at a connection portion between the furnace opening portion 209 and the exhaust pipe 231. A pressure sensor 245, an APC (Automatic Pressure Controller) valve 243 and a vacuum pump 246 are sequentially connected to the exhaust pipe 231 from an upstream side to a downstream side of the exhaust pipe 231. The APC valve 243 serves as a pressure adjustment valve and the vacuum pump 246 serves as a vacuum exhaust apparatus. The vacuum pump 246 is configured to exhaust the process chamber 201 such that an inner pressure of the process chamber 201 reaches and maintains at a predetermined pressure (vacuum degree). The APC valve 243, the pressure sensor 245 and the vacuum pump 246 are electrically connected to a controller 280 to constitute a pressure control system.

A seal cap 219 configured to seal a lower end opening of the furnace opening portion 209 is provided under the furnace opening portion 209. The seal cap 219 is in contact with the lower end of the furnace opening portion 209 from thereunder. The seal cap 219 is of a disk shape. An outer diameter of the seal cap 219 is equal to or greater than an outer diameter of the reaction tube 203. The seal cap 219 may be moved upward or downward by a boat elevator 115 vertically provided outside the reaction tube 203 while maintaining a horizontal orientation of the seal cap 219.

The boat 217 serving as a substrate retainer configured to accommodate (support) the plurality of the wafers including the wafer 200 is vertically supported on the seal cap 219. The boat 217 includes a pair of end plates (that is, an upper end plate 210 and a lower end plate 211) and a plurality of wafer support parts (for example, 4 wafer support parts according to the embodiments) 212. The plurality of the wafer support parts 212 is provided vertically between the upper end plate 210 and the lower end plate 211. For example, the upper end plate 210, the lower end plate 211 and the plurality of the wafer support parts 212 are made of a high heat resistant material such as quartz (SiO2) and silicon carbide (SiC).

Support recesses (not shown) are engraved at each of the plurality of the wafer support parts 212 at equal intervals in a lengthwise direction of each of the plurality of the wafer support parts 212. Support recesses of the same stage of the plurality of the wafer support parts 212 face one another. By inserting a peripheral edge of each of the plurality of the wafers including the wafer 200 into the support recesses of the same stage of the plurality of the wafer support parts 212, the boat 217 supports the plurality of the wafers vertically arranged in multiple stages while the plurality of the wafers being in horizontal orientation with their centers aligned with each other.

A plurality of heat insulating plates 218 is provided between the boat 217 and the seal cap 219. Each of the plurality of the heat insulating plates 218 is of a disk shape. The plurality of the heat insulating plates 218 is vertically arranged in multiple stages while the plurality of the heat insulating plates 218 being in horizontal orientation. For example, the plurality of the heat insulating plates 218 is made of a heat resistant material such as quartz and SiC. The plurality of the heat insulating plates 218 is configured to suppress the transmission of the heat from a heater 207 described later to the seal cap 219.

A boat rotating mechanism 267 configured to rotate the boat 217 is provided below the seal cap 219 opposite to the process chamber 201. A boat rotating shaft 255 of the boat rotating mechanism 267 is connected to the boat 217 through the seal cap 219. The boat rotating shaft 255 supports the boat 217 from thereunder. As the boat rotating mechanism 267 rotates the boat rotating shaft 255, the plurality of the wafers including the wafer 200 in the process chamber 201 is rotated. The seal cap 219 may be moved upward or downward in the vertical direction by the boat elevator 115 described above. When the seal cap 219 is moved upward or downward by the boat elevator 115, the boat 217 may be transferred (loaded) into the process chamber 201 or transferred (unloaded) out of the process chamber 201.

The boat rotating mechanism 267 and the boat elevator 115 are electrically connected to the controller 280 to constitute a drive control system.

The heater 207 serving as a heating mechanism configured to heat an inside of the reaction tube 203 uniformly or at a predetermined temperature distribution is provided outside the reaction tube 203 so as to surround the reaction tube 203. The heater 207 is vertically installed by being supported by the housing of the substrate processing apparatus 101. For example, the heater 207 is embodied by a resistance heater such as a carbon heater.

A temperature sensor 263 serving as a temperature detector is provided in the reaction tube 203. The heater 207 and the temperature sensor 263 are electrically connected to the controller 280 to constitute a temperature control system.

As gas supply pipes, a nozzle (also referred to as a "first gas supply pipe") 410, a nozzle (also referred to as a "second gas supply pipe") 420 and a nozzle (also referred to as a "third gas supply pipe") 430 are provided in the process chamber 201 to penetrate the side wall of the furnace opening portion 209. Like to the nozzle 410, the nozzles 420 and 430 are provided along an inner wall of the reaction tube 203 when viewed from a cross-section taken along the line A-A shown in FIG. 1. Gas pipes 310 and 320 configured to supply a source gas are connected to the nozzles 410 and 420, respectively. For example, a gas pipe 390 configured to supply a reactive gas is connected to the nozzle 430. As described above, for example, three nozzles 410, 420 and 430 and three gas pipes 310, 320 and 390 are provided in the reaction tube 203.

A plurality of gas supply holes 410a, a plurality of gas supply holes 420a and a plurality of gas supply holes 430a configured to supply (eject) a gas such as the source gas and the reactive gas are provided on side surfaces of the nozzles 410, 420, and 430, respectively. The plurality of the gas supply holes 410a and the plurality of the gas supply holes 430a are open toward a center of the reaction tube 203. The plurality of the gas supply holes 420a is open toward an outer peripheral portion of the reaction tube 203. The plurality of the gas supply holes 410a, the plurality of the gas supply holes 420a and the plurality of the gas supply holes 430a are provided from a lower portion to an upper portion of the reaction tube 203, and have the same opening area and the same pitch.

MFCs (Mass Flow Controllers) 312, 322 and 392 serving as flow rate controllers (flow rate control mechanisms) and valves 314, 324 and 394 serving as opening/closing valves are sequentially installed at the gas pipes 310, 320 and 390, respectively, from upstream sides to downstream sides of the gas pipes 310, 320 and 390. The nozzles 410, 420 and 430 are connected to front end portions of the gas pipes 310, 320 and 390, respectively. Each of the nozzles 410, 420 and 430 may include an L-shaped nozzle. Horizontal portions of the nozzles 410, 420 and 430 are installed through the side wall of the furnace opening portion 209. Vertical portions of the nozzles 410, 420 and 430 are installed in an annular space provided between the inner wall of the reaction tube 203 and the plurality of the wafers including the wafer 200. That is, the vertical portions of the nozzles 410, 420 and 430 are installed in the annular space along the inner wall of the reaction tube 203, and extend from the lower portion to the upper portion of the reaction tube 203 (that is, from one end toward the other end of a wafer arrangement region in which the plurality of the wafers including the wafer 200 is stacked).

According to the embodiments, the gas such as the source gas and the reactive gas is supplied through the nozzles 410, 420 and 430 provided in a vertically long annular space which is defined by the inner wall of the reaction tube 203 and edge portions of the plurality of the wafers including the wafer 200 stacked in the reaction tube 203. Then, the gas is ejected into the reaction tube 203 around the plurality of the wafers through the plurality of the gas supply holes 410*a*, the plurality of the gas supply holes 420*a* and the plurality of the gas supply holes 430*a* of the nozzles 410, 420, and 430 facing the plurality of the wafers, respectively. Specifically, the gas is ejected into the reaction tube 203 in a direction parallel to the surfaces of the plurality of the wafers, that is, in a horizontal direction through the plurality of the gas supply holes 410*a*, the plurality of the gas supply holes 420*a* and the plurality of the gas supply holes 430*a* of the nozzles 410, 420 and 430, respectively. Therefore, it is possible to uniformly supply the gas onto each of the plurality of the wafers.

The gas that has flowed parallel to the surfaces of the plurality of the wafers, that is, a remaining gas in the process chamber 201 after the reaction (that is, a residual gas) flows toward the exhaust pipe 231 described later.

Inert gas pipes 510, 520 and 530 configured to supply an inert gas serving as a carrier gas are connected to the gas pipes 310, 320 and 390, respectively. MFCs 512, 522 and 532 and valves 514, 524 and 534 are sequentially installed at the inert gas pipes 510, 520 and 530, respectively, from upstream sides to downstream sides of the inert gas pipes 510, 520 and 530.

For example, the source gas serving as one of process gases is supplied into the process chamber 201 through the gas pipe 310 provided with the MFC 312 and the valve 314 and the nozzle 410. The same source gas as the source gas supplied through the gas pipe 310 serving as one of the process gases is supplied into the process chamber 201 through the gas pipe 320 provided with the MFC 322 and the valve 324 and the nozzle 420. The reactive gas serving as one of a process gas is supplied into the process chamber 201 through the gas pipe 390 provided with the MFC 392 and the valve 394 and the nozzle 430. A silicon (Si)-containing gas such as dichlorosilane (SiH2Cl2, abbreviated as DCS) gas and hexachlorodisilane (Si2Cl6, abbreviated as HCDS) gas may be used as the source gas. The embodiments will be described by way of an example in which the source gas supplied through the gas pipe 310 is same as the source gas supplied through the gas pipe 320. However, the embodiments are not limited thereto as long as the source gas supplied through the gas pipe 310 is of same type as that of the source gas supplied through the gas pipe 320.

The inert gas serving as the carrier gas is supplied into the process chamber 201 through the inert gas pipes 510, 520 and 530 provided with the MFCs 512, 522 and 532 and the valves 514, 524 and 534, respectively, the nozzles 410 and 420 and the nozzle 430. The inert gas also serves as one of the process gases. Nitrogen (N2) gas or a rare gas such as helium (He) gas, neon (Ne) gas, argon (Ar) gas and xenon (Xe) gas may be used as the inert gas.

When the process gas is supplied through the gas pipes 310, 320 and 390 and the inert gas pipes 510, 520 and 530 as described above, a process gas supply system is constituted mainly by the gas pipes 310, 320 and 390, the inert gas pipes 510, 520 and 530, the MFCs 312, 322, 392, 512, 522 and 532, the valves 314, 324, 394, 514, 524 and 534. In addition, the process gas supply system may further include the nozzles 410, 420 and 430.

When the source gas is supplied through the gas pipes 310 and 320 as described above, a source gas supply system is constituted mainly by the gas pipes 310 and 320, the MFCs 312 and 322 and the valves 314 and 324. In addition, the source gas supply system may further include the inert gas pipes 510 and 520, the MFCs 512 and 522 and the valves 514 and 524. The source gas supply system may further include the nozzles 410 and 420.

When the reactive gas is supplied through the gas pipe 390 as described above, a reactive gas supply system is constituted mainly by the gas pipe 390, the MFC 392 and the valve 394. In addition, the reactive gas supply system may further include the inert gas pipe 530, the MFC 532 and the valve 534. The reactive gas supply system may further include the nozzle 430.

The MFCs 312, 322, 392, 512, 522 and 532, and the valves 314, 324, 394, 514, 524 and 534 are electrically connected to the controller 280 to constitute a process gas supply control system (also simply referred to as a "gas supply control system"). In addition, the process gas supply control system (the gas supply control system) may further include the pressure sensor 245, the APC valve 243 and the vacuum pump 246.

(2) Controller

Hereinafter, the controller 280 serving as a control device (control mechanism) will be described with reference to FIG. 2.

Figure 2:
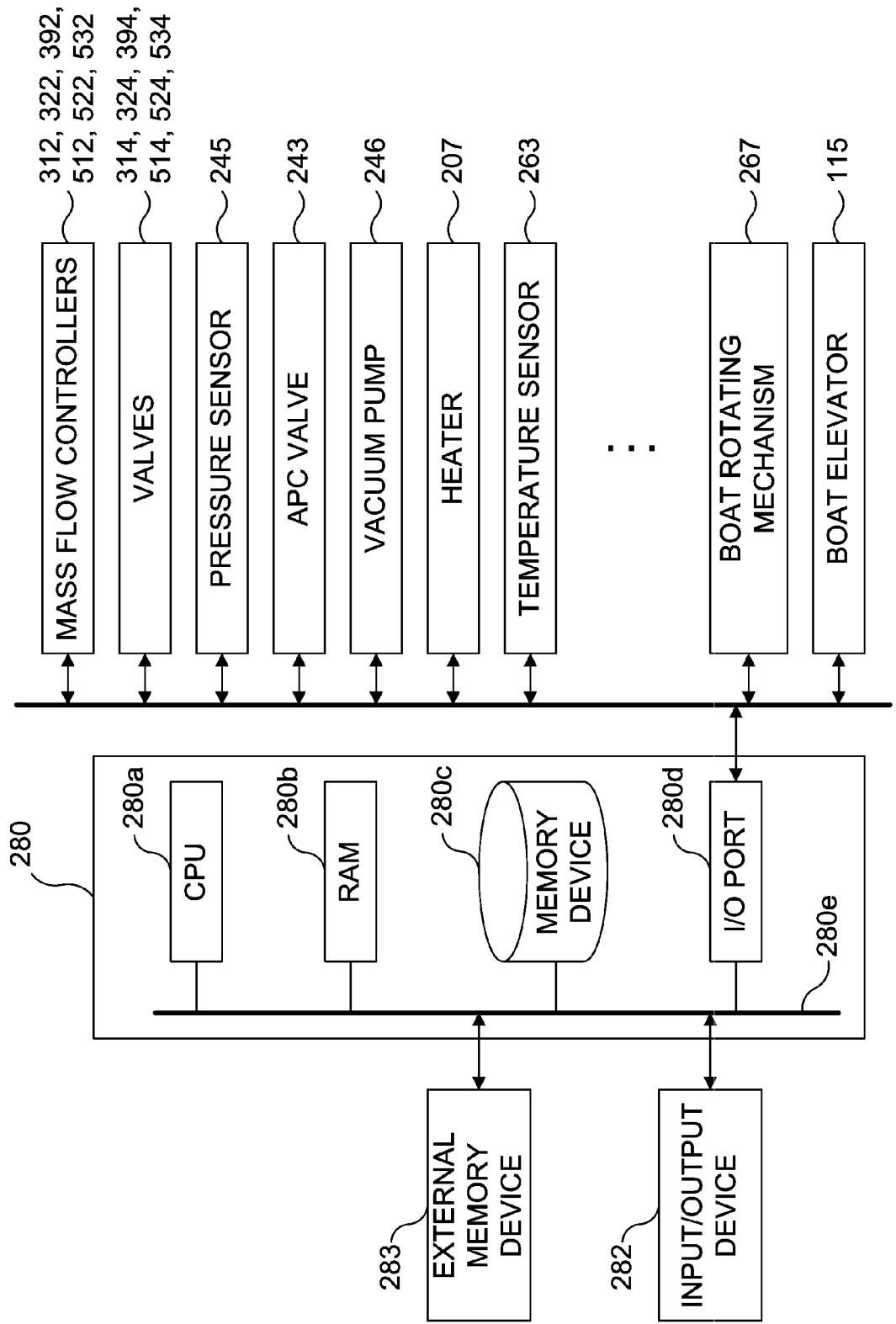
FIG. 2 is a block diagram schematically illustrating a configuration of a controller and related components of the substrate processing apparatus according to the embodiments described herein.

As shown in FIG. 2, the controller 280 serving as a control device (control mechanism) is constituted by a computer including a CPU (Central Processing Unit) 280*a*, a RAM (Random Access Memory) 280*b*, a memory device 280*c* and an I/O port 280*d*. The RAM 280*b*, the memory device 280*c* and the I/O port 280*d* may exchange data with the CPU 280*a* through an internal bus 280*e*. For example, an input/output device 282 such as a touch panel is connected to the controller 280.

For example, the memory device 280*c* is configured by components such as a flash memory and HDD (Hard Disk Drive). A control program for controlling the operation of the substrate processing apparatus 101 or a process recipe containing information on the sequences and conditions of a substrate processing described later is readably stored in the memory device 280*c*. The process recipe is obtained by combining steps of the substrate processing described later such that the controller 280 can execute the steps to acquire a predetermine result, and functions as a program. Hereinafter, the process recipe and the control program are collectively referred to as a "program". In the present specification, the term "program" may indicate only the process recipe, indicate only the control program, or indicate both of the process recipe and the control program. The RAM 280b functions as a memory area (work area) where a program or data read by the CPU 280a is temporarily stored.

The I/O port 280d is connected to the above-described components such as the MFCs 312, 322, 392, 512, 522 and 532, the valves 314, 324, 394, 514, 524 and 534, the APC valve 243, the pressure sensor 245, the vacuum pump 246, the heater 207, the temperature sensor 263, the boat rotating mechanism 267 and the boat elevator 115.

The CPU 280a is configured to read the control program from the memory device 280c and execute the control program. Furthermore, the CPU 280a is configured to read the process recipe from the memory device 280c according to an instruction such as an operation command inputted from the input/output device 282. According to the contents of the process recipe read from the memory device 280c, the CPU 280a may be configured to control various operations such as flow rate adjusting operations for various gases by the MFCs 312, 322, 392, 512, 522 and 532, opening/closing operations of the valves 314, 324, 394, 514, 524 and 534, an opening/closing operation of the APC valve 243, a pressure adjusting operation by the APC valve 243 based on the pressure sensor 245, a temperature adjusting operation of the heater 207 based on the temperature sensor 263, a start and stop of the vacuum pump 246, an operation of adjusting rotation and rotation speed of the boat 217 by the boat rotating mechanism 267 and an elevating and lowering operation of the boat 217 by the boat elevator 115.

The controller 280 may be embodied by installing the above-described program stored in an external memory device 283 into a computer. For example, the external memory device 283 may include a magnetic tape, a magnetic disk such as a flexible disk and a hard disk, an optical disk such as a CD and a DVD, a magneto-optical disk such as an MO and a semiconductor memory such as a USB memory a memory card. The memory device 280c or the external memory device 283 may be embodied by a non-transitory computer-readable recording medium. Hereafter, the memory device 280c and the external memory device 283 are collectively referred to as recording media. In the present specification, the term "recording media" may indicate only the memory device 280c, may indicate only the external memory device 283, or may indicate both of the memory device 280c and the external memory device 283. Instead of the external memory device 283, a communication means such as the Internet and a dedicated line may be used to provide the program to the computer.

(3) Substrate Processing

Hereinafter, an exemplary sequence of the substrate processing (that is, an exemplary sequence of a film-forming process) of forming a film on the substrate, which is a part of manufacturing processes of a semiconductor device, will be described. The exemplary sequence of the film-forming process is performed by using the substrate processing apparatus 101 described above. Hereinafter, the exemplary sequence of the film-forming process will be described by way an example in which the film is formed on the wafer 200 by alternately supplying a first process gas (that is, the source gas) and a second process gas (that is, the reactive gas) to the wafer 200.

Hereinafter, an example in which a silicon nitride film (Si3N4 film) (hereinafter, also referred to as an "SiN film") is formed on the wafer 200 by using the HCDS gas as the source gas and ammonia (NH3) gas as the reactive gas. In the following descriptions, the operations of the components constituting the substrate processing apparatus 101 are controlled by the controller 280.

According to the exemplary sequence of the film-forming process, the SiN film is formed on the wafer 200 by performing a cycle a predetermined number of times (at least twice). For example, the cycle may include: a step of supplying the HCDS gas to the wafer 200 in the process chamber 201; a step of removing the HCDS gas (that is, the residual gas) from the process chamber 201; a step of supplying the NH3 gas to the wafer 200 in the process chamber 201; and a step of removing the NH3 gas (that is, the residual gas) from the process chamber 201. The steps of the cycle described above are non-simultaneously performed.

In the present specification, the exemplary sequence of the film-forming process described above may be represented as follows:

(HCDS→NH3)×n=>SiN

In the following descriptions, the same also applies to other examples.

In the present specification, the term "wafer" may refer to "a wafer itself" or refer to "a wafer and a stacked structure (aggregated structure) of a predetermined layer (or layers) or a film (or films) formed on a surface of the wafer". In addition, "a surface of a wafer" refers to "a surface of the wafer itself" or "a surface of a predetermined layer (or layers) or a film (or films) formed on the wafer". Thus, in the present specification, "forming a predetermined layer (or film) on a wafer" may refer to "forming a predetermined layer (or film) on a surface of the wafer itself" or may refer to "forming a predetermined layer (or film) on a surface of another layer or a film formed on the wafer". In the present specification, the terms "substrate" and "wafer" may be used as substantially the same meaning. That is, the term "substrate" may be substituted by "wafer" and vice versa.

<Wafer Charging and Boat Loading Step>

After the plurality of the wafers including the wafer 200 is transferred (charged) to the boat 217 (wafer charging step), the boat 217 charged with the plurality of the wafers is elevated by the boat elevator 115 and loaded (transferred) into the process chamber 201 (boat loading step). With the boat 217 loaded, the seal cap 219 hermetically seals (closes) the lower end of the reaction tube 203 via an O-ring 220.

<Pressure Adjusting and Temperature Adjusting Step>

The vacuum pump 246 exhausts (vacuum-exhausts) the inner atmosphere of the process chamber 201 such that the inner pressure of the process chamber 201 reaches a predetermined pressure (vacuum degree) and maintains the predetermined pressure. The inner pressure of the process chamber 201 is measured by pressure sensor 245, and the APC valve 243 is feedback-controlled based on the measured pressure information. The vacuum pump 246 continuously exhausts the inner atmosphere of the process chamber 201 until at least the substrate processing of the wafer 200 is completed.

The heater 207 heats the process chamber 201 such that a temperature of the wafer 200 reaches a predetermined temperature and maintains the predetermined temperature. The state of the electric conduction to the heater 207 is feedback-controlled based on the temperature detected by the temperature sensor 263 such that the inner temperature of the process chamber 201 has a predetermined temperature distribution. The heater 207 continuously heats the process chamber 201 until at least the substrate processing of the wafer 200 is completed. Then, before a film-forming step described later is performed, the boat 217 and the plurality of the wafers including the wafer 200 are rotated by the boat rotating mechanism 267 and moved to a predetermined position (for example, a position where the source gas does not interfere with the plurality of the wafer support parts (also referred to as support columns) 212 of the boat 217).

<Film-forming Step>

When the inner temperature of the process chamber 201 is stabilized at a predetermined process temperature and the operation of the boat rotating mechanism 267 is stopped after moving the plurality of the wafers including the wafer 200 to the predetermined position, the film-forming step is performed by sequentially performing the following two steps, that is, a first step and a second step. According to the embodiments, during the first step and the second step, the boat 217 and the plurality of the wafers including the wafer 200 are not rotated by the boat rotating mechanism 267. That is, the rotation of the wafer 200 is stopped. In addition, "the rotation of the wafer 200 is stopped" means not only directly stopping the rotation of the wafer 200 but also stopping the rotation of the structure (for example, the boat 217) on which the wafer 200 is placed, so that both the wafer 200 and the structure are not rotated.

<First Step>

The first step includes a source gas supply step and a first purge step.

<Source Gas Supply Step>

In the source gas supply step, the HCDS gas is supplied to the wafer 200 in the process chamber 201. The valves 314 and 324 are opened to supply the HCDS gas into the process chamber 201. Specifically, the flow rate of the HCDS gas is adjusted by the MFCs 312 and 322. The HCDS gas having the flow rate thereof adjusted is then supplied into the process chamber 201 through the nozzles 410 and 420, and is exhausted through the exhaust pipe 231. In the source gas supply step, simultaneously, the valves 514 and 524 are opened to supply the N2 gas serving as the inert gas into the process chamber 201. After the flow rate of the N2 gas is adjusted by the MFCs 512 and 522, the N2 gas having the flow rate thereof adjusted is supplied into the process chamber 201 with the HCDS gas, and is exhausted the exhaust pipe 231.

By supplying the HCDS gas to the wafer 200, a silicon-containing layer whose thickness is, for example, less than one atomic layer to several atomic layers is formed as a first layer on an outermost surface of the wafer 200.

<First Purge Step>

After the first layer is formed, the valves 314 and 324 are closed to stop the supply of the HCDS gas into the process chamber 201. With the APC valve 243 open, the vacuum pump 246 vacuum-exhausts the inner atmosphere of the process chamber 201 to remove the HCDS gas in the process chamber 201 which did not react or which contributed to the formation of the first layer from the process chamber 201. In the first purge step, by maintaining the valves 514 and 524 open, the N2 gas is continuously supplied into the process chamber 201. The N2 gas serves as the purge gas, which improves the efficiency of removing the residual gas such as the HCDS gas in the process chamber 201 from the process chamber 201.

<Second Step>

The second step includes a reactive gas supply step and a second purge step.

<Reactive Gas Supply Step>

After the first step is completed, the NH3 gas is supplied to the first layer formed on the wafer 200. In the reactive gas supply step, the NH3 gas is thermally activated and then supplied to the wafer 200.

In the reactive gas supply step, the valve 394 is controlled in the same manners as the valves 314 and 324 are controlled in the source gas supply step. The flow rate of the NH3 gas is adjusted by the MFC 392. Then, the NH3 gas having the flow rate thereof adjusted is supplied into the process chamber 201 through the pipe 390, and is exhausted through the exhaust pipe 231. Thereby, the NH3 gas is supplied to the wafer 200 in the process chamber 201.

The NH3 gas supplied to the wafer 200 reacts with at least a portion of the first layer (that is, the silicon-containing layer) formed on the wafer 200 in the source gas supply step of the first step. As a result, the first layer is thermally nitrided by non-plasma, and is modified (changed) into a second layer containing silicon (Si) and nitrogen (N), that is, a silicon nitride layer (also referred to as an "SiN layer").

<Second Purge Step>

After the second layer is formed, the valve 394 is closed to stop the supply of the NH3 gas into the process chamber 201. The inner atmosphere of the process chamber 201 is vacuum-exhausted to remove the NH3 gas in the process chamber 201 which did not react or which contributed to the formation of the second layer or the reaction by-products from the process chamber 201 in the same manners as in the first purge step.

<Performing a Predetermined Number of Times>

By performing the cycle wherein the first step and the second step are performed non-simultaneously a predetermined number of times (N times) (at least twice), the SiN film of a predetermined thickness and a predetermined composition is formed on the wafer 200. That is, the cycle is performed (repeated) until a total thickness of the SiN film formed by stacking the second layer by performing the cycle a plurality of times reaches the predetermined thickness under the conditions that the second layer formed in each cycle is thinner than the predetermined thickness.

After each cycle described above is performed, the boat rotating mechanism 267 rotates the boat 217 and the plurality of the wafers including the wafer 200. The predetermined number of times (N times) may be, for example, twice to 200 times. According to the embodiments, the second purge step of each cycle is completed (that is, each cycle is completed) when a certain amount of the residual gas is exhausted from the process chamber 201 (for example, when a predetermined time has elapsed). For example, an event of termination of the second purge step of each cycle may be output to the controller 280 after the predetermined time has elapsed. After each cycle is completed and before its next cycle is started, a wafer rotation step (also referred to as a "substrate rotation step") described later is performed. Specifically, a rotation angle of rotating the wafer 200 is calculated according to the predetermined number (N) of performing the cycle, and the wafer 200 (that is, the plurality of the wafers) is rotated according to the calculated rotation angle. For example, the controller 280 may send an operation start instruction to the boat rotating mechanism 267. When the wafer 200 is being rotated by the boat rotating mechanism 267 in the wafer rotation step (that is, when a wafer rotation operation by the boat rotating mechanism 267 is performed), the same purge operation as in the second purge step may be performed, or the process chamber 201 may be vacuum-exhausted with the supply of the inert gas stopped. In addition, the wafer rotation step may include a confirmation step of confirming whether or not to perform the wafer rotation operation by the boat rotating mechanism 267 after each cycle.

Instead of the event of termination of the second purge step described above, an event of start of the wafer rotation step may be simply output to the controller 280 when the predetermined time has elapsed during the second purge step, and the second purge step and the wafer rotation operation of the wafer rotation step may be performed in parallel. However, when the event of start of the wafer rotation is used, the second purge step cannot be completed unless an event of the rotation of the wafer 200 is terminated (that is, unless the wafer 200 is rotated by the rotation angle described later).

Figure 3:
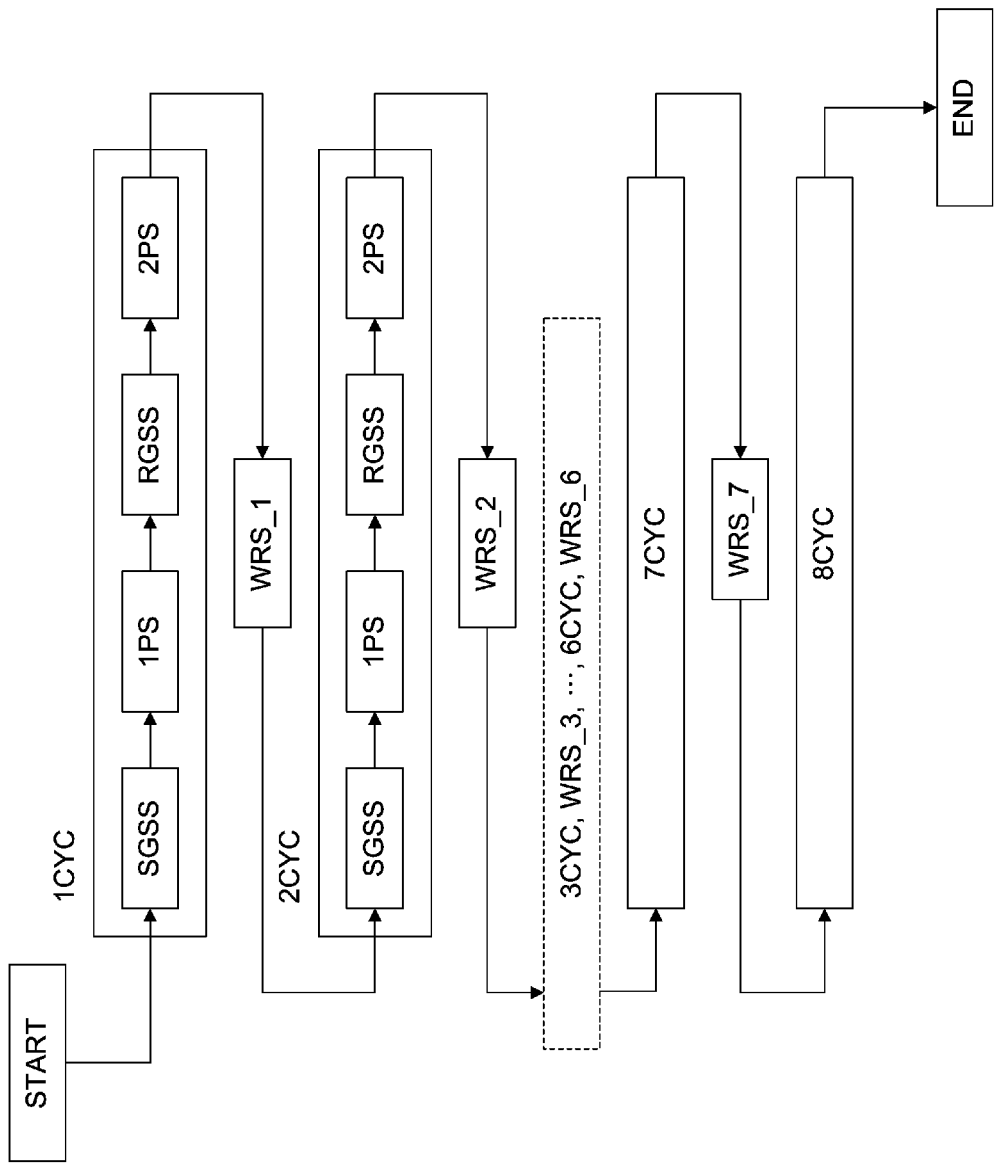
FIG. 3 schematically illustrates a film-forming process according to the embodiments described herein.
Figure 4:
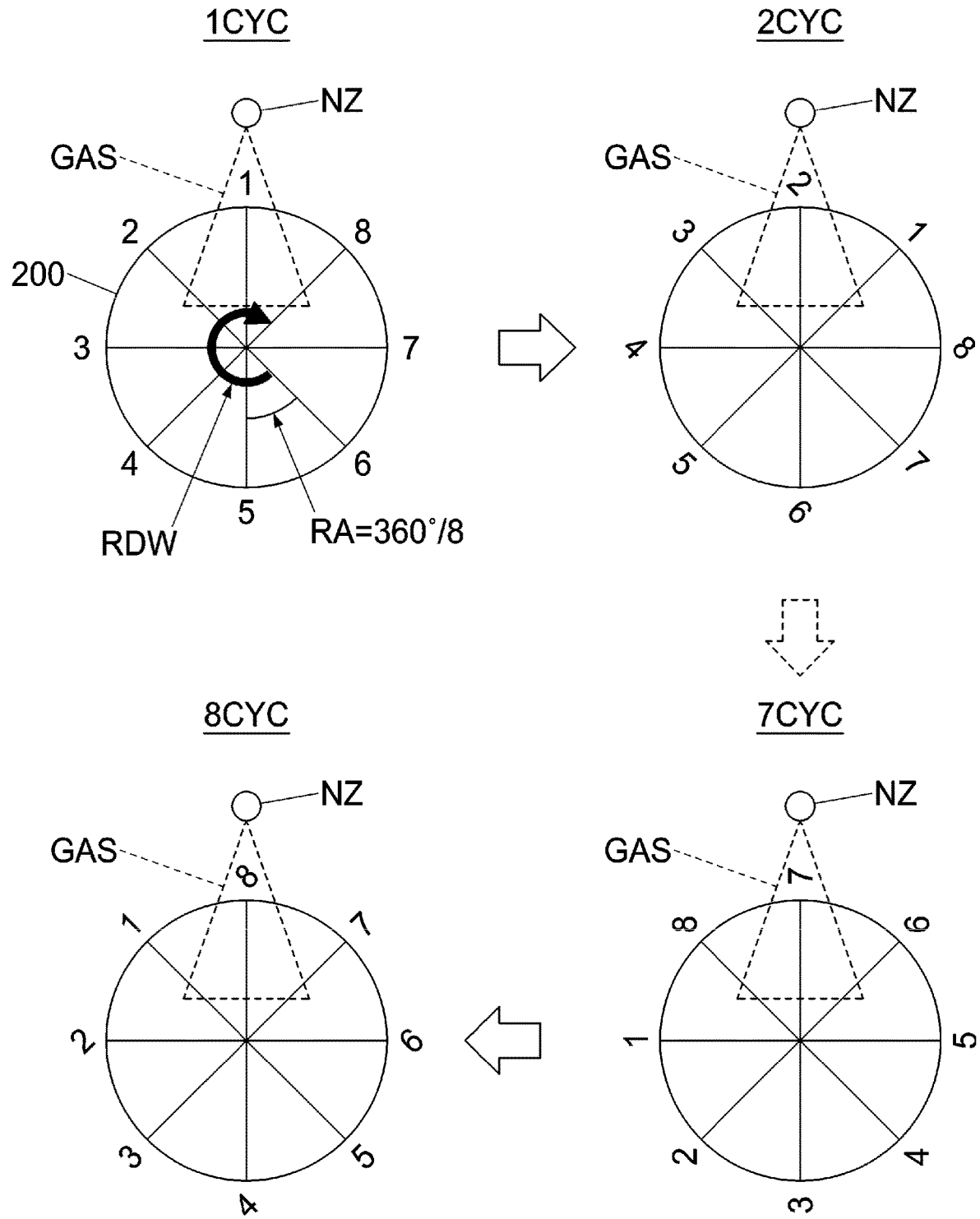
FIG. 4 schematically illustrates rotation states of a wafer according to the embodiments described herein.

FIG. 3 schematically illustrates the film-forming process according to the embodiments described herein. FIG. 4 schematically illustrates rotation states of the wafer according to the embodiments described herein.

The film-forming process shown in FIG. 3 includes the film-forming step and the wafer rotation step. For example, the film-forming step and the wafer rotation step where the predetermined number of times (N times) is set to 8 times (that is, N=8) are shown in FIG. 3. In FIG. 3, the film-forming step refers to the film-forming step of each cycle. In FIG. 3, for explaining the rotation states of the wafer 200, processing conditions of the substrate processing including processing conditions such as the second purge step (for example, purging with the inert gas) that may be performed during the wafer rotation step is omitted. Hereinafter, the wafer rotation operation by the boat rotating mechanism 267 will be described in detail.

When the film-forming process is started (indicated by "START" in FIG. 3), a first cycle (indicated by "1CYC" in FIG. 3) is performed. In FIG. 3, each cycle (indicated by "1CYC" through "8CYC" in FIG. 3) refers to a processing step including the source gas supply step (indicated by "SGSS" in FIG. 3), the first purge step (indicated by "1PS" in FIG. 3), the reactive gas supply step (indicated by "RGSS" in FIG. 3) and the second purge step (indicated by "2PS" in FIG. 3) described above. The source gas supply step, the first purge step, the reactive gas supply step and the second purge step are performed sequentially in this order in each cycle. For the sake of simplification of the drawing, the description of the above-described processing step is omitted for a third cycle ("3CYC") through an eighth cycle ("8CYC").

After the first cycle 1CYC is completed, a first wafer rotation step (indicated by "WRS_1" in FIG. 3) of rotating wafer 200 by the rotation angle is performed. After the first wafer rotation step WRS_1 is completed, a second cycle ("2CYC") is then performed. After the second cycle 2CYC is completed, a second wafer rotation step (indicated by "WRS_2" in FIG. 3) through a seventh wafer rotation step (indicated by "WRS_7" in FIG. 3) are sequentially performed. Then, the eighth cycle 8CYC is performed, and the film-forming process is completed (indicated by "END" in FIG. 3).

As described above, in the film-forming process, the wafer rotation step WRS (that is, the first wafer rotation step WRS_1 through the seventh wafer rotation step WRS_7) of rotating the wafer 200 by the rotation angle (indicated by "RA" in FIGS. 4 and 6) is performed for each cycle (more specifically, between each cycle and its next cycle). Since the cycle is performed a plurality number of times while rotating the wafer 200 by the rotation angle for each cycle, the process gas can easily reach the center of the wafer 200 without being affected by the rotation of the wafer 200.

Alternatively, the by-products in the vicinity of the center of the wafer 200 may be easily discharged. In addition, a film is formed on the wafer 200 by supplying the source gas and the reactive gas at equal intervals in a circumferential direction of the wafer 200 at the same number of times. Therefore, it is possible to reduce a thickness difference of the film between the center of the wafer 200 and an outer peripheral portion of the wafer 200, and it is also possible to form the film on the wafer 200 with good uniformity.

FIG. 4 schematically illustrates the rotation states of the wafer 200 (that is, the positions of the wafer 200) corresponding to the first cycle 1CYC, the second cycle 2CYC, the seventh cycle 7CYC and the eighth cycle 8CYC shown in FIG. 3 when viewed from above. As described with reference to FIG. 3, the wafer 200 is rotated in the wafer rotation step WRS (that is, the wafer 200 is rotated in each of the first wafer rotation step WRS_1 through the seventh wafer rotation step WRS_7) in units of the rotation angle RA when viewed from above. The rotation angle RA may be determined to be 45° obtained by dividing 360° by 8 (that is, RA=360°/8=45°).

First, the wafer 200 will be described with reference to the rotation states of the wafer 200 during performing the cycle (that is, the first cycle 1CYC through the eighth cycle 8CYC) shown in FIG. 4. The angular positions (orientations) of the wafer 200 are designated for every 45° along the circumferential direction so as to correspond to the number of times of performing the cycle (that is, 8 times where N=8), and reference numerals "1" through "8" are assigned to the angular positions of the wafer 200. Hereinafter, the above-described "angular position(s)" of the wafer 200 will be simply referred to as "position(s)" of the wafer 200. The reference numeral "1" indicates the position of wafer 200 in the first cycle 1CYC, and the reference numeral "2" indicates the position of wafer 200 in the second cycle 2CYC. The reference numeral "3" indicates the position of wafer 200 in the third cycle 3CYC, the reference numeral "4" indicates the position of wafer 200 in the fourth cycle 4CYC, the reference numeral "5" indicates the position of wafer 200 in the fifth cycle 5CYC, the reference numeral "6" indicates the position of wafer 200 in the sixth cycle 6CYC, the reference numeral "7" indicates the position of wafer 200 in the seventh cycle 7CYC, and the reference numeral "8" indicates the position of wafer 200 in the eighth cycle 8CYC.

According to the example shown in FIG. 4, the position of the wafer 200 in each cycle indicates the position of the wafer 200 when the gas (indicated by "GAS" in FIG. 4) such as the source gas and the reactive gas is supplied through the nozzle (indicated by "NZ" in FIG. 4) in the source gas supply step SGSS and the reactive gas supply step RGSS of each cycle. The gas is supplied to the wafer 200 by passing through the portions indicated by the dotted lines shown in FIG. 4. The nozzle NZ corresponds to the nozzles 410, 420 and 430.

In the example shown in FIG. 4, a rotation direction of the wafer 200 (indicated by "RDW" in FIG. 4) is clockwise (right) direction. That is, the wafer 200 is rotated clockwise in each cycle by the rotation angle RA of 45° obtained by dividing 360° by 8 (that is, RA=360°/8=45°). The rotation direction of the wafer 200 (RDW) may be counterclockwise (left) direction. In addition, it is not necessary to keep the wafer 200 stationary at times other than the wafer rotation step WRS (that is, "WRS_1" through "WRS_8"). For example, the wafer 200 may be rotated at a lower speed than the rotation speed of the wafer 200 in the wafer rotation step WRS. For example, a speed of moving the edge of the substrate (that is, the wafer 200) due to the rotation of the wafer 200 may be 10% or less than a flow velocity of the gas flowing between the plurality of the substrates (the plurality of the wafers including the wafer 200). When the wafer 200 is rotated at the lower speed than the rotation speed of the wafer 200 in the wafer rotation step WRS, the sum of the rotation amount of the wafer 200 in the wafer rotation step of each cycle and the rotation amount of the wafer 200 in steps other than the wafer rotation step in each cycle should be equivalent to the rotation angle RA.

Referring to FIG. 4, in the first cycle 1CYC, the wafer 200 is located at the position identified by the reference numeral 1, and in this state, the source gas or the reactive gas is supplied to wafer 200 through the nozzle NZ. In the second cycle 2CYC, the wafer 200 is rotated clockwise by 45° with respect to the position identified by the reference numeral 1. As a result, in the second cycle 2CYC, the wafer 200 is located at the position identified by the reference numeral 2, and in this state, the source gas or the reactive gas is supplied to wafer 200 through the nozzle NZ. Similarly, in the seventh cycle 7CYC, the wafer 200 is rotated clockwise by 270° (=45°×6) with respect to the position identified by the reference numeral 1. As a result, in the seventh cycle 7CYC, the wafer 200 is located at the position identified by the reference numeral 7, and in this state, the source gas or the reactive gas is supplied to wafer 200 through the nozzle NZ. Similarly, in the eighth cycle 8CYC, the wafer 200 is rotated clockwise by 315° (=45°×7) with respect to the position identified by the reference numeral 1. As a result, in the eighth cycle 8CYC, the wafer 200 is located at the position identified by the reference numeral 8, and in this state, the source gas or the reactive gas is supplied to wafer 200 through the nozzle NZ.

As described above, the circumference of the wafer 200 is divided equally along a circumferential direction by the number of times (N times) of performing the cycle, and each cycle is performed while the wafer 200 is located at each position corresponding thereto. Therefore, it is possible to form the film on the wafer 200 with good uniformity. However, the embodiments are not limited thereto. For example, the rotation angle RA may be determined by adding a predetermined angle $\alpha$ and the angle obtained by dividing 360° by N (N is the number of times of performing the cycle). The predetermined angle $\alpha$ is greater than 0° and less than (360°/N). That is, the rotation angle RA may be represented by "RA=(360°/N)+$\alpha$", and 0<$\alpha$<(360°/N). For example, by determining the rotation angle RA by shifting the predetermined angle $\alpha$, it is possible to supply the gas without being affected by the plurality of the support columns 212 of the boat 217 even in a case where the gas including the source gas supplied through the nozzle NZ would otherwise be affected by the plurality of the support columns 212 of the boat 217 at the angle calculated by "360°/N". In addition, the rotation angle RA may be determined by "RA=360°×k/N" instead of "RA=360°/N", where k is a number determined appropriately. For example, when the number of times of performing the cycle is 80 (that is, N=80), the rotation angle RA is determined to be 4.5°. When the rotation angle RA is 4.5°, it is difficult to supply the gas without being affected by the plurality of the support columns 212 of the boat 217. However, when the rotation angle RA is determined to be 45° according to the formula "360°×k/N" described above where k is set to 10 and N is 8, it is possible to supply the gas without being affected by the plurality of the support columns 212 of the boat 217. A step of determining the rotation angle RA as described above will be described later.

In FIG. 4, the reference numerals 1 through 8 indicating the positions of the wafer 200 of each cycle are illustrated sequentially along the circumference of the wafer 200. With such a configuration, it is possible to simplify a configuration of the control program of the controller 280. However, the embodiments are not limited thereto. The reference numerals 1 through 8 may be randomly assigned to the positions of the wafer 200 although this may complicate the configuration of the control program.

For example, the process conditions when the film-forming step is performed are as follows:
Processing Temperature (the temperature of the wafer): 250° C. to 700° C.;
Processing Pressure (the inner pressure of the process chamber): 1 Pa to 4,000 Pa;
Flow rate of the HCDS gas: 1 sccm to 2,000 sccm;
Flow rate of the NH3 gas: 100 sccm to 10,000 sccm; and
Flow rate of the N2 gas (when the HCDS gas is supplied): 100 sccm to 10,000 sccm.

By selecting suitable values within these process conditions described above, it is possible to perform the film-forming step properly.

<Purging and Returning to Atmospheric Pressure Step>

After the film-forming step is completed, the valves 314, 324 and 394 are closed to stop the supply of the gas such as the source gas and the reactive gas. With the APC valve 243 of the exhaust pipe 231 open, the vacuum pump 246 vacuum-exhausts the inner atmosphere of the process chamber 201 to remove the gas such as the source gas and the reactive gas in the process chamber 201 from the process chamber 201. By supplying the inert gas such as the N2 gas through the nozzles 410, 420 and 430 to the process chamber 201 and exhausting the inert gas, an inside of the process chamber 201 is purged with the inert gas (gas purging step). Thereafter, the inner atmosphere of the process chamber 201 is replaced with the inert gas (substitution by inert gas), and the inner pressure of the process chamber 201 is returned to the atmospheric pressure (returning to atmospheric pressure step).

<Boat Unloading and Wafer Discharging Step>

Thereafter, the seal cap 219 is lowered by the boat elevator 115 and the lower end of the reaction tube 203 is opened. The boat 217 with the plurality of processed wafers including the wafer 200 charged therein is transferred (unloaded) out of the reaction tube 203 through the lower end of the reaction tube 203. Then, the plurality of the processed wafers including the wafer 200 is transferred (discharged) out of the boat 217.

Hereinafter, a manufacturing process of a semiconductor device will be described with reference to FIG. 5, and the step of determining the rotation angle RA will be described with reference to FIG. 6.

Figure 5:
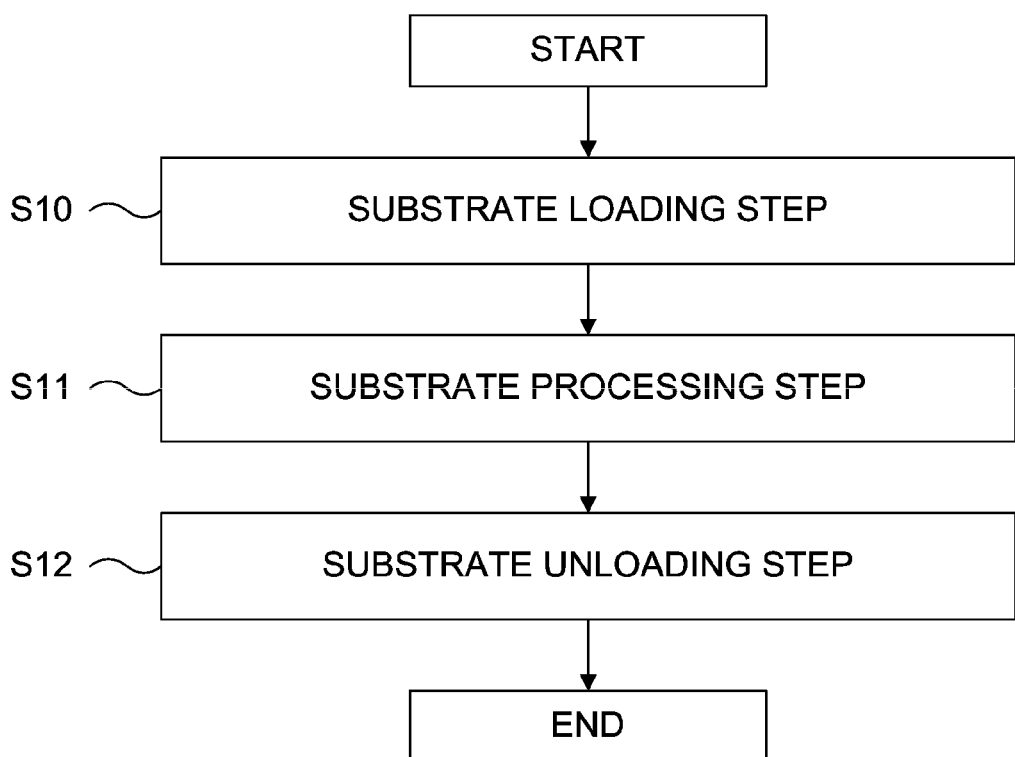
FIG. 5 schematically illustrates a manufacturing process according to the embodiments described herein.

FIG. 5 schematically illustrates the manufacturing process according to the embodiments described herein. The manufacturing process of the semiconductor device includes a substrate loading step S10, a substrate processing step S11, and a substrate unloading step S12.

As described above, in the substrate loading step S10, the substrate retainer (that is, the boat 217) charged with the plurality of the wafers including the wafer 200 is loaded into the process chamber 201.

In the substrate processing step S11, the film is formed on the plurality of the wafers including the wafer 200 by performing a cycle a predetermined number of times to the plurality of the wafers including the wafer 200 loaded into the process chamber 201. The cycle includes the source gas supply step SGSS, the first purge step 1PS, the reactive gas supply step RGSS and the second purge step 2PS described above with reference to FIG. 3. The plurality of the wafers including the wafer 200 is rotated in each cycle by the rotation angle RA. When the plurality of the wafers including the wafer 200 is being rotated in each cycle, the same purge step as in the second purge step 2PS may be performed.

In the substrate unloading step S12, the boat 217 with the plurality of processed wafers including the wafer 200 charged therein is transferred (unloaded) out of the reaction tube 203 through the lower end portion of the reaction tube 203. Then, the plurality of the processed wafers including the wafer 200 is transferred (discharged) out of the boat 217.

The manufacturing process of the semiconductor device is incorporated in the control program of the controller 280 as control sequences. The manufacturing process of the semiconductor device is controlled by the controller 280 configured to perform the control program.

Figure 6:
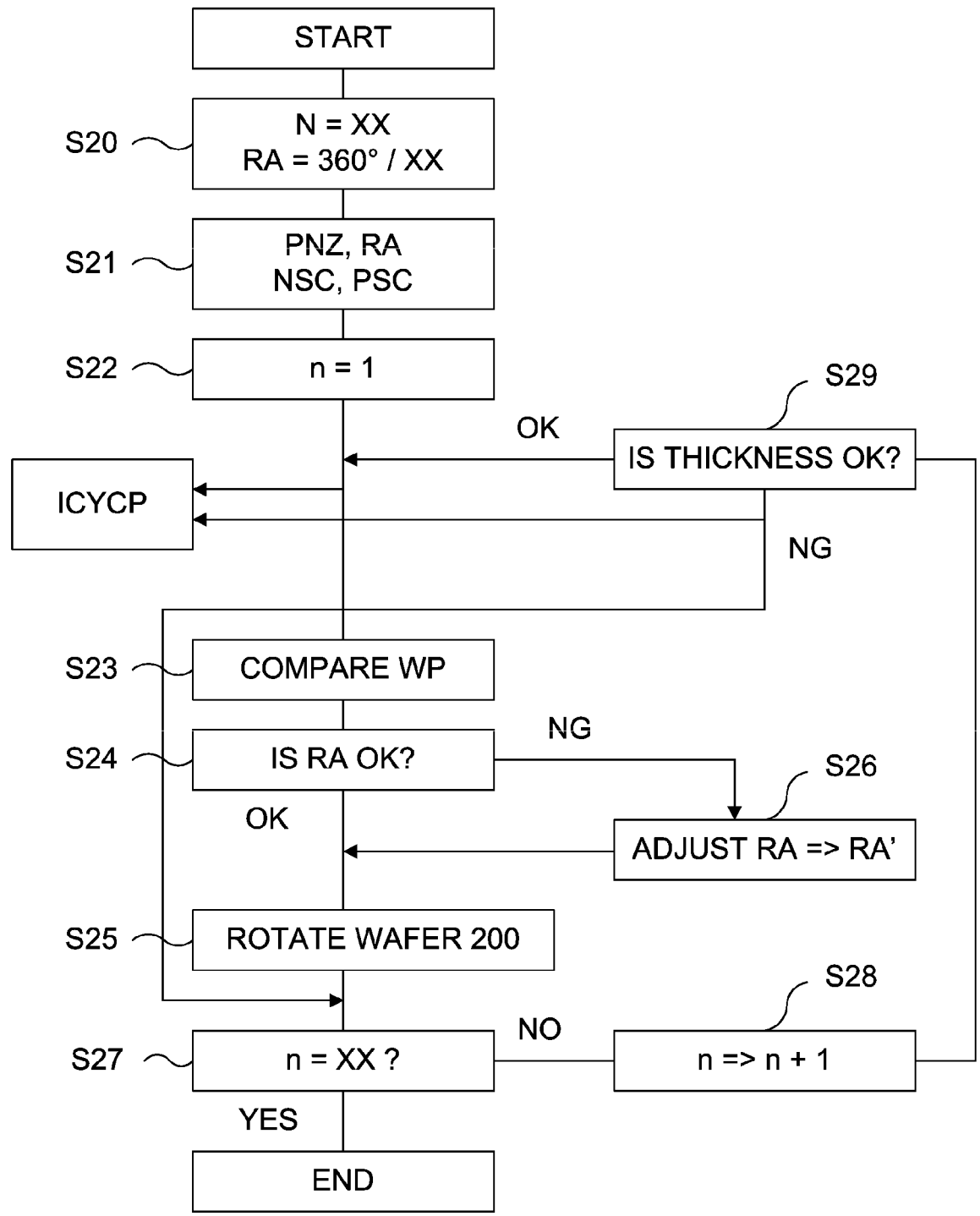
FIG. 6 schematically illustrates an example of a step (or a control sequence) of determining a rotation angle.

FIG. 6 schematically illustrates an example of the step (or a control sequence) of determining the rotation angle RA. The rotation angle RA of rotating the wafer 200 in each cycle may be determined by the number (NSC) and the positional relationship (PSC) of the plurality of the wafer support parts (support columns) 212 of the boat 217 supporting the plurality of the wafers including the wafer 200 and the position (PNZ) of the nozzles 410, 420 and 430 (hereinafter, simply referred to as the nozzle NZ) which are supply ports of the gas such as the source gas and the reactive gas. For example, after the wafer 200 is rotated, the gas such as the source gas and the reactive gas supplied through the nozzle NZ may interfere with the plurality of the support columns of the boat 217, which is considered as undesirable in the film-forming step. Therefore, it is preferable that the controller 280 is configured to perform the control program including the step (or the control sequence) of determining the rotation angle RA as shown in FIG. 6.

In addition, for example, it is preferable to perform a step of measuring a thickness of the film being formed (SiN film) after performing the cycle (for example, after performing each cycle). For example, when performing each cycle, the thickness of the film is measured. In addition, it is determined whether or not the measured thickness of the film is within a predetermined range, and it is determined whether or not to rotate the wafer 200. When it is determined that the measured thickness of the film is within the predetermined range, the next cycle is performed after rotating wafer 200 by the rotation angle RA. When it is determined that the measured thickness of the film is less than the predetermined range, the same cycle is performed again without rotating the wafer 200. Thereby, it is possible to promote or uniformize the growth of the film.

The step (or the control sequence) of determining the rotation angle RA will be described with reference to FIG. 6.

When the step (or the control sequence) of determining the rotation angle RA is started (indicated by "START" in FIG. 6), the following steps are performed.

In a step S20, an initial rotation angle is calculated from a value (indicated by "XX") indicating the predetermined number (N) of times of performing the cycle. In the step S20, the rotation angle is obtained by dividing 360° by the value XX (that is, RA=360°/XX).

In a step S21, an undesirable position of the wafer 200 is calculated based on the number (NSC) and the positional relationship (PSC) of the plurality of the support columns (SC) 212 of the boat 217, the position (PNZ) of the nozzle NZ which is the supply port of the gas such as the source gas and the reactive gas and the rotation angle RA. In the step S21, it may be determined whether a current position of the wafer 200 is the undesirable position. Thereby, it is possible to confirm whether or not a start position of the process (that is, the film-forming process) is appropriate.

In step S22, a number n is set to 1 in order to perform an nth cycle, and the execution of the nth cycle is prepared. For example, in order to perform the first cycle 1CYC, the number n is set to 1, and the execution of the first cycle is prepared. Then, the controller 280 instructs the execution of the nth cycle (indicated by "ICYCP" in FIG. 6), and the nth cycle is performed. For example, the first cycle 1CYC is performed when the number n is 1.

In a step S23, a next position of the wafer 200 when the current position of the wafer 200 in the nth cycle is rotated by the rotation angle RA is compared with the undesirable position of the wafer 200 obtained in the step S21 (indicated by "COMPARE WP" in FIG. 6).

In a step 24, a relationship between the result of the step S23 and the rotation angle RA is determined (indicated by "IS RA OK?" in FIG. 6). When the rotation angle RA is appropriate (indicated by "OK" in FIG. 6) in the step S24, a step S25 is performed.

When the rotation angle RA is inappropriate (indicated by "NG" in FIG. 6) in the step S24, a step S26 is performed.

In the step S26, the rotation angle RA is fine-tuned (adjusted), and is changed to an adjusted rotation angle RA' (indicated by "ADJUST RA=>RA'" in FIG. 6). The adjusted rotation angle RA' is determined in consideration of the undesirable position of the wafer 200. For example, the adjusted rotation angle RA' may be obtained by adding or subtracting the predetermined angle α to the rotation angle RA. For example, the adjusted rotation angle RA' may be obtained by multiplying the rotation angle RA by the number k determined appropriately.

When the rotation angle RA is appropriate (indicated by "OK" in FIG. 6) in the step S24, the wafer 200 is rotated by the rotation angle RA in the step S25 (indicated by "ROTATE WAFER 200" in FIG. 6). That is, the controller 280 is configured to operate the boat rotating mechanism 267 to rotate the boat 217 and the plurality of the wafers including the wafer 200 by the rotation angle RA. On the other hand, when the rotation angle RA is changed to the adjusted rotation angle RA' in the step S26, the controller 280 is configured to operate the boat rotating mechanism 267 to rotate the boat 217 and the plurality of the wafers including the wafer 200 by the adjusted rotation angle RA' in the step S25.

In a step S27, it is determined whether the number n has reached the value XX (indicated by "n=XX?" in FIG. 6). When the number n has reached the value XX (indicated by "YES" in FIG. 6), the step of determining the rotation angle RA is completed (indicated by "END" in FIG. 6). On the other hand, when the number n has not reached the value XX (indicated by "NO" in FIG. 6), a step S28 is performed.

In the step S28, the number n is incremented by 1 (indicated by "n=>n+1" in FIG. 6), and a step S29 is performed.

In the step S29, the thickness of the film being formed (SiN film) is measured, and it is determined whether or not the measured thickness of the film is within a predetermined thickness range (indicated by "IS THICKNESS OK?" in FIG. 6). When it is determined that the measured thickness of the film is within the predetermined thickness range (indicated by "OK" in FIG. 6) in the step S29, the controller 280 instructs the execution of the nth cycle (indicated by "ICYCP" in FIG. 6), and the nth cycle is performed. For example, the second cycle 2CYC is performed when the number n is 2.

When it is determined that the measured thickness of the film is not within the predetermined thickness range (indicated by "NG" in FIG. 6) in the step S29, that is, it is determined that the thickness of the film is thin (i.e., insufficient), the controller 280 instructs the execution of the nth cycle (indicated by "ICYCP" in FIG. 6), and the nth cycle is performed. For example, the second cycle 2CYC is performed when the number n is 2. In addition, the step S27 is performed without performing the step S23 through the step S25.

Thereafter, the step S23 through the step S29 are sequentially performed. When the number n has reached the value XX (indicated by "YES" in FIG. 6) in the step S27, the step of determining the rotation angle RA is completed (indicated by "END" in FIG. 6).

While the above-described embodiments are described by way of an example in which the substrate processing apparatus 101 shown in FIG. 1 is used, the above-described technique is not limited thereto. That is, the above-described technique is not limited to the configuration of the substrate processing apparatus 101, and the substrate processing apparatus 101 may be provided with a mechanism of operating (for example, rotating) the support parts that support the plurality of the wafers including the wafer 200. In addition, a single wafer type apparatus or a multi wafer type apparatus configured to process the wafer 200 or a plurality of wafers including the wafer 200 placed on a susceptor with the process gas may be used. When the single wafer type apparatus or the multi wafer type apparatus provided with the susceptor is used, it is not necessary to consider the influence of the plurality of the support columns 212 of the boat 217 in the step of determining the rotation angle RA due to the configuration of the single wafer type apparatus or the multi wafer type apparatus. Therefore, the above-described technique may be preferably applied to the single wafer type apparatus or the multi wafer type apparatus.

According to the embodiments described above, it is possible to provide one or more advantageous effects described below.

(a) By performing the cycle a plurality number of times while rotating the wafer 200 by the rotation angle RA for each cycle, the process gas can easily reach the center of the wafer 200 without being affected by the rotation of the wafer 200. Alternatively, the by-products in the vicinity of the center of the wafer 200 can be easily discharged. Therefore, it is possible to reduce the thickness difference of the film between the center of the wafer 200 and the outer peripheral portion of the wafer 200, and it is also possible to form the film on the wafer 200 with good uniformity.

(b) As shown in FIG. 4, the circumference of the wafer 200 is divided equally along a circumferential direction by the number of times of performing the cycle, and each cycle is performed while the wafer 200 is located at each position corresponding thereto. Therefore, it is possible to supply the gas such as the source gas and the reactive gas at equal intervals in the circumferential direction of the wafer 200 at the same number of times. As a result, it is possible to uniformize the thickness of the film formed on the wafer 200. That is, it is possible to form the film on the wafer 200 with good uniformity.

(c) As shown in FIG. 6, it is possible to adjust the rotation angle RA of rotating the wafer 200 in each cycle by the number (NSC) and the positional relationship (PSC) of the plurality of the support columns 212 of the boat 217 supporting the plurality of the wafers including the wafer 200 and the position (PNZ) of the nozzle NZ which is the supply port of the gas such as the source gas and the reactive gas. Accordingly, it is possible to prevent the undesirable state in which the gas such as the source gas and the reactive gas supplied through the nozzle NZ may interfere with the plurality of the support columns (SC) of the boat 217. As a result, it is possible to uniformize the thickness of the film formed on the wafer 200. That is, it is possible to form the film on the wafer 200 with good uniformity.

(d) As shown in FIG. 6, the step of measuring the thickness of the film being formed (SiN film) is performed after performing the cycle (for example, after performing each cycle). When it is determined that the measured thickness of the film is less than the predetermined range, the next cycle is performed without rotating the wafer 200. Thereby, it is possible to promote or uniformize the growth of the film.

(e) According to the embodiments, it is possible to reduce the thickness difference of the film between the center of the wafer 200 and the outer peripheral portion of the wafer 200 without being affected by the rotation of the wafer 200, and it is also possible to form the film on the wafer 200 with good uniformity. Therefore, it is possible to suppress the phenomenon (also referred to as an "LE effect") which is one of the problems associated with the increase in a surface area of a patterned wafer due to recent advances in the pattern miniaturization and multi-layering. According to the LE effect, it is difficult to supply the gas such as the source gas and the reactive gas to the center of the wafer 200, and as a result, the thickness of the film in a central portion of the wafer 200 is reduced.

(f) According to the embodiments, in particular, when the patterned wafer with a large diameter (for example, 400 mm or more) is used, it is possible to suppress the phenomenon ("LE effect") that the gas hardly reaches the center of the wafer 200 to thereby reduce the thickness of the film in the central portion of the wafer 200. In addition, the term "patterned wafer" refers to the wafer 200 in which a fine pattern is formed on a surface thereof, such as the wafer 200 whose surface area is several times or more than that of a normal wafer.

Other Embodiments

While the technique is described in detail by way of the above-described embodiments, the above-described technique is not limited thereto. The above-described technique may be modified in various ways without departing from the gist thereof.

For example, according to the embodiments described above, the boat rotating mechanism 267 does not rotate the boat 217 and the plurality of the wafers including the wafer 200 during the cycle (that is, the source gas supply step, the first purge step, the reactive gas supply step and the second purge step). That is, the wafer 200 is kept stationary during the cycle. However, the above-described technique is not limited thereto. For example, according to a modified example of the embodiments, the rotation of the wafer 200 is stopped during the source gas supply step, the first purge step and the reactive gas supply step of the cycle, and the boat 217 and the plurality of the wafers including the wafer 200 may be rotated by the boat rotating mechanism 267 between the start of the reactive gas supply step of the cycle and before the source gas supply step of its next cycle. That is, the second purge step and the wafer rotation step may be performed in parallel (that is, simultaneously). According to the modified example, the difference from the embodiments described above is that the operation start instruction from the controller 280 to the boat rotating mechanism 267 is issued at the end of the cycle (or at the end of the second purge step (for example, a predetermined time has elapsed)) or at the end of the reactive gas supply step (or at the start of the second purge step).

According to the modified example, the substrate is processed by performing a substrate processing including a step of supplying the source gas, a first purge step of discharging (exhausting) at least the source gas, a step of supplying the reactive gas and a second purge step of discharging (exhausting) at least the reactive gas. According to the substrate processing of the modified example, the wafer 200 is kept stationary during the step of supplying the source gas, the first purge step and the step of supplying the reactive gas (that is, the wafer 200 is not rotated by the boat rotating mechanism 267), and the wafer 200 is rotated by the boat rotating mechanism 267 between the start of the second purge step of the cycle and before the step of supplying the source gas of its next cycle. For example, when the step of supplying the reactive gas is completed, the controller 280 outputs an event of termination of the reactive gas supply step (or an event of start of the second purge step) and operates the boat rotating mechanism 267 to rotate the wafer 200. According to the modified example, the wafer 200 is rotated during the second purge step (with the start of the second purge step) of the cycle rather than providing the wafer rotation step after the cycle. Therefore, there is no need to wait for the end of the second purge step (for example, the lapse of a predetermined time). As a result, it is possible to improve the throughput of the substrate processing.

According to the modified example, not only the substrate processing apparatus 101 described above but also the single wafer type apparatus or the multi wafer type apparatus may be used. In addition, the same controller 280 may be used as a controller for the modified example. According to the modified example, since the difference from the embodiments described above is only the timing of operating the boat rotating mechanism 267, it is possible to provide at least one of the effects (a) through (f) described above.

While the above-described embodiments are described by way of an example in which the HCDS gas serving as the source gas is used, the above-described technique is not limited thereto. Instead of the HCDS gas, for example, an inorganic halosilane source gas such as monochlorosilane (SiH3Cl, abbreviated as MCS) gas, dichlorosilane (SiH2Cl2, abbreviated as DCS) gas, trichlorosilane (SiHCl3, abbreviated as TCS) gas, tetrachlorosilane gas, that is, silicon tetrachloride (SiCl4, abbreviated as STC) gas and octachlorotrisilane (Si3Cl8, abbreviated as OCTS) gas may be used as the source gas. Instead of the HCDS gas, for example, an amino-based (amine-based) silane source gas free of halogen group such as trisdimethylaminosilane (Si[N(CH3)2]3H, abbreviated as 3DMAS) gas, tetrakisdimethylaminosilane (Si[N(CH3)2]4, abbreviated as 4DMAS) gas, bisdiethylaminosilane (Si[N(C2H5)2]2H2, abbreviated as BDEAS) gas and bis(tertiary-butyl amino)silane gas (SiH2[NH(C4H9)]2, abbreviated as BTBAS) gas may also be used as the source gas. Instead of the HCDS gas, for example, an inorganic silane source gas free of halogen group such as monosilane (SiH4, abbreviated as MS) gas, disilane (Si2H6, abbreviated as DS) gas and trisilane (Si3H8, abbreviated as TS) gas may also be used as the source gas.

In addition, while the above-described embodiments are described by way of an example in which the NH3 gas serving as the reactive gas is used, the above-described technique is not limited thereto. Instead of the NH3 gas, for example, a hydrogen nitride-based gas such as diazene (N2H2) gas, hydrazine (N2H4) gas, N3H8 gas and compounds thereof may be used as the reactive gas. Instead of the NH3 gas, for example, an ethylamine-based gas such as triethylamine ((C2H5)3N, abbreviated as TEA) gas, diethylamine ((C2H5)2NH, abbreviated as DEA) gas and monoethylamine (C2H5NH2, abbreviated as MEA) gas may also be used as the reactive gas. Instead of the NH3 gas, for example, a methylamine-based gas such as trimethylamine ((CH3)3N, abbreviated as TMA) gas, dimethylamine ((CH3)2NH, abbreviated as DMA) gas and monomethylamine (CH3NH2, abbreviated as MMA) may also be used as the reactive gas. Instead of the NH3 gas, for example, an organic hydrazine-based gas such as trimethylhydrazine ((CH3)2N2(CH3)H, abbreviated as TMH) gas may also be used as the reactive gas.

In addition, while the above-described embodiments are described by way of an example in which the SiN film is formed by using the HCDS gas as the source gas and the nitrogen (N)-containing gas such as the NH3 gas as the reactive gas, the above-described technique is not limited thereto. For example, the above-described technique may be applied to the formation of a film such as a silicon oxide film (SiO film), a silicon oxynitride film (SiON film), a silicon oxycarbonitride film (SiOCN film), a silicon oxycarbide film (SiOC film), a silicon carbonitride film (SiCN film), a silicon boronitride film (SiBN film) and a silicon boron carbonitride film (SiBCN film) according to film-forming sequences by using an oxygen-containing gas (oxidizing gas) such as an oxygen (O2) gas, a carbon-containing gas such as a propylene (C3H6) gas and a boron-containing gas such as boron trichloride (BCl3) instead of or in addition to the gases described above. In addition, the order of supplying the gases may be changed appropriately.

In addition, while above-described embodiments are described based on the semiconductor manufacturing apparatus and the method of manufacturing the semiconductor device, the above-described technique is not limited thereto. For example, the above-described technique may be applied to a manufacturing apparatus for processing a glass substrate such as an LCD (Liquid Crystal Display) manufacturing apparatus and a method of manufacturing the LCD.

While the above-described embodiments are described by way of an example in which the film is deposited on the wafer 200, the above-described technique is not limited thereto. For example, the above-described technique may be preferably applied to processes such as an oxidation process, a diffusion process, an annealing process and an etching process of the wafer 200 or the film or layer formed on the wafer 200.

For example, the above-described technique may be applied to a processing apparatus configured to process a substrate placed on a predetermined support part by repeatedly performing a predetermined cycle.

According to some embodiments in the present disclosure, it is possible to form a film with good uniformity on a substrate by reducing a thickness difference between a film formed on a center of the substrate and an outer peripheral portion of the substrate.

What is claimed is:
1. A substrate processing apparatus comprising:
   a process chamber in which a substrate is processed;
   a process gas supply system configured to supply a process gas into the process chamber;

a rotating mechanism configured to rotate the substrate; and a controller configured to control the process gas supply system and the rotating mechanism to supply the process gas in a state where the substrate is stopped while a cycle of supplying the process gas is performed a predetermined number of times; and rotate the substrate by a predetermined angle obtained by dividing a circumference of the substrate equally by the predetermined number of times while the process gas is not supplied to the substrate.

2. The substrate processing apparatus of claim 1, wherein the controller is further configured to control the process gas supply system and the rotating mechanism to supply the process gas at least once in the state where the substrate is stopped while the cycle of supplying the process gas is performed the predetermined number of times.

3. The substrate processing apparatus of claim 1, wherein the controller is further configured to control the process gas supply system and the rotating mechanism to prevent the substrate from being rotated by the rotating mechanism while the process gas is being supplied.

4. The substrate processing apparatus of claim 1, wherein the controller is further configured to control the process gas supply system to perform the cycle of supplying the process gas and a cycle of purging the process chamber.

5. The substrate processing apparatus of claim 1, wherein the controller is further configured to control the process gas supply system to perform a cycle of purging the process chamber while the cycle of supplying the process gas is not being performed.

6. The substrate processing apparatus of claim 5, wherein the controller is further configured to control the process gas supply system and the rotating mechanism to rotate the substrate by the predetermined angle after terminating the cycle of purging the process chamber and before starting the cycle of supplying the process gas.

7. The substrate processing apparatus of claim 5, wherein the cycle of supplying the process gas comprises: (a) supplying a source gas; and (b) supplying a reactive gas,
wherein the controller is further configured to control the process gas supply system to repeatedly perform (a) and (b) as a single cycle.

8. The substrate processing apparatus of claim 7, wherein the cycle of supplying the process gas further comprises: (c) purging the process chamber, and
wherein the controller is further configured to control the process gas supply system to perform (c) between (a) and (b).

9. The substrate processing apparatus of claim 7, further comprising a substrate retainer in which the substrate is supported,
wherein the cycle of supplying the process gas further comprises: (d) rotating the substrate, and
wherein the controller is further configured to control the process gas supply system and the rotating mechanism to perform (d) by operating the substrate retainer before a start of (a).

10. The substrate processing apparatus of claim 9, wherein (d) comprises: (d-1) determining the predetermined angle by which the substrate is rotated,
wherein the controller is further configured to perform (d-1) so as to prevent the source gas from interfering with a plurality of support columns of the substrate retainer.

11. The substrate processing apparatus of claim 10, wherein the controller is further configured to confirm whether or not the substrate is rotated by the predetermined angle in (d-1).

12. The substrate processing apparatus of claim 5, wherein the controller is further configured to control the process gas supply system to repeatedly perform the cycle of supplying the process gas and the cycle of purging the process chamber as a single cycle.

13. The substrate processing apparatus of claim 12, wherein the controller is further configured to control the process gas supply system and the rotating mechanism to rotate the substrate after the single cycle is performed the predetermined number of times.

14. The substrate processing apparatus of claim 12, wherein the controller is further configured to the process gas supply system and the rotating mechanism to perform the single cycle a plurality number of times, and
wherein the controller is further configured to complete a substrate processing without rotating the substrate after a last execution of the single cycle among the plurality number of times.

15. The substrate processing apparatus of claim 12, wherein the controller is further configured to control the process gas supply system and the rotating mechanism to rotate the substrate after performing the single cycle and not to rotate the substrate while the single cycle is being performed.

16. The substrate processing apparatus of claim 15, wherein the controller is further configured to control the process gas supply system to rotate the substrate after every completion of the single cycle.

17. The substrate processing apparatus of claim 1, further comprising a substrate retainer in which the substrate is supported,
wherein the controller is further configured to control the rotating mechanism to rotate the substrate retainer and the substrate supported by the substrate retainer.

18. The substrate processing apparatus of claim 1, wherein the controller is further configured to fine-tune a position of the substrate after the substrate is rotated.

19. A non-transitory computer-readable recording medium storing a program related to a substrate processing apparatus comprising a process chamber in which a substrate is processed, a process gas supply system configured to supply a process gas into the process chamber, an exhaust system configured to discharge the process gas from the process chamber, and a controller configured to control the process gas supply system and the exhaust system to perform a cycle of supplying the process gas a predetermined number of times, wherein the program causes, by a computer, the substrate processing apparatus to perform (A) processing the substrate, wherein (A) comprises:

(a) supplying the process gas while the substrate is stopped; and (b) rotating the substrate by a predetermined angle obtained by dividing a circumference of the substrate equally by the predetermined number of times while the process gas is not supplied to the substrate.

* * * * *